US009142469B2

(12) United States Patent
Takahashi

(10) Patent No.: US 9,142,469 B2
(45) Date of Patent: Sep. 22, 2015

(54) SEMICONDUCTOR DEVICE

(71) Applicant: PS4 Luxco S.a.r.l., Luxembourg (LU)

(72) Inventor: Tetsuji Takahashi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/339,077

(22) Filed: Jul. 23, 2014

(65) Prior Publication Data

US 2014/0332813 A1    Nov. 13, 2014

Related U.S. Application Data

(63) Continuation of application No. 13/353,898, filed on Jan. 19, 2012, now Pat. No. 8,816,342.

(30) Foreign Application Priority Data

Jan. 27, 2011    (JP) ................................. 2011-014787

(51) Int. Cl.
*H01L 21/66* (2006.01)
*H01L 23/528* (2006.01)
*H01L 23/00* (2006.01)

(52) U.S. Cl.
CPC ............ *H01L 22/32* (2013.01); *H01L 23/5286* (2013.01); *H01L 24/06* (2013.01); *H01L 24/05* (2013.01); *H01L 2224/02166* (2013.01); *H01L 2224/04042* (2013.01); *H01L 2224/05553* (2013.01); *H01L 2224/0603* (2013.01); *H01L 2224/06051* (2013.01)

(58) Field of Classification Search
CPC .......... H01L 2224/48247; H01L 2224/48227; H01L 2224/05553; H01L 24/05; H01L 24/06
USPC .......................... 257/43, 738, 778; 438/14, 15
See application file for complete search history.

(56) References Cited

U.S. PATENT DOCUMENTS

| | | | | |
|---|---|---|---|---|
| 6,008,542 | A * | 12/1999 | Takamori | 257/773 |
| 6,025,733 | A * | 2/2000 | Saitoh et al. | 324/750.3 |
| 6,429,675 | B2 * | 8/2002 | Bell | 324/754.11 |
| 7,852,101 | B2 * | 12/2010 | Tanioka et al. | 324/755.07 |
| 8,183,695 | B2 * | 5/2012 | Yamazaki | 257/773 |
| 2009/0134523 | A1 * | 5/2009 | Yamazaki | 257/773 |
| 2012/0032329 | A1 * | 2/2012 | Shigihara et al. | 257/738 |

* cited by examiner

*Primary Examiner* — Jaehwan Oh

(57) ABSTRACT

A device comprises a semiconductor chip including an edge elongated in a first direction. A plurality of first pads is formed on the semiconductor chip. The first pads are substantially equal in length in the first direction to each other. A second pad is formed on the semiconductor chip. The second pad is greater in length in the first direction than the first pads. The first pads and the second pad are arranged in a line elongated in the second direction, that is substantially perpendicular to the first direction, without an intervention of any one of the first pads between the second pad and the edge.

18 Claims, 8 Drawing Sheets

| PAD NUM. |         | PAD NUM. |            |
|----------|---------|----------|------------|
| 1        | VDD     | 21       | CF_CLKB_P  |
| 2        | VSS     | 22       | CF_HIZ_P   |
| 3        | PBOPCK3 | 23       | CF_WEB_P   |
| 4        | PBOP16_P| 24       | CF_CASB_P  |
| 5        | VREF0   | 25       | CF_RASB_P  |
| 6        | VBBSA   | 26       | CF_CSB_P   |
| 7        | VPLT    | 27       | CF_BA0_P   |
| 8        | CF_TW_P | 28       | CF_BA1_P   |
| 9        | CF_A04_P| 29       | CF_A10_P   |
| 10       | CF_A05_P| 30       | CF_A00_P   |
| 11       | CF_A06_P| 31       | CF_A01_P   |
| 12       | CF_A07_P| 32       | CF_A02_P   |
| 13       | CF_A08_P| 33       | CF_A03_P   |
| 14       | CF_A09_P| 34       | VARY       |
| 15       | CF_A11_P| 35       | VBB        |
| 16       | CF_A12_P| 36       | VPP        |
| 17       | CF_CKE_P| 37       | PBOPIWLBI_P|
| 18       | VDD     | 38       | VSS        |
| 19       | VSS     | 39       | PBOPSDR_P  |
| 20       | CF_CLK_P| 40       | VDD        |

| PAD NUM. | | PAD NUM. | |
|---|---|---|---|
| 41 | VDD | 71 | CP_CLK_P |
| 42 | VSS | 72 | DQ15 |
| 43 | DQ31 | 73 | DQ14 |
| 44 | DQ30 | 74 | VSSQ |
| 45 | VDDQ | 75 | VDDQ |
| 46 | VSSQ | 76 | DQ13 |
| 47 | DQ29 | 77 | DQ12 |
| 48 | DQ28 | 78 | DQ11 |
| 49 | DQ27 | 79 | DQ10 |
| 50 | DQ26 | 80 | DQ09 |
| 51 | DQ25 | 81 | DQ08 |
| 52 | DQ24 | 82 | DM1 |
| 53 | DM3 | 83 | DQS1 |
| 54 | DQS3 | 84 | VSSQ |
| 55 | VDDQ | 85 | VDDQ |
| 56 | VSSQ | 86 | DQS0 |
| 57 | DQS2 | 87 | DM0 |
| 58 | DM2 | 88 | DQ07 |
| 59 | DQ23 | 89 | DQ06 |
| 60 | DQ22 | 90 | DQ05 |
| 61 | DQ21 | 91 | DQ04 |
| 62 | DQ20 | 92 | DQ03 |
| 63 | DQ19 | 93 | DQ02 |
| 64 | DQ18 | 94 | VSSQ |
| 65 | VDDQ | 95 | VDDQ |
| 66 | VSSQ | 96 | DQ01 |
| 67 | DQ17 | 97 | DQ00 |
| 68 | DQ16 | 98 | VSS |
| 69 | VSS | 99 | VDD |
| 70 | CP_CLKB_P | | |

FIG. 6

SEMICONDUCTOR DEVICE

CROSS REFERENCE TO RELATED APPLICATIONS

This application is a continuation of U.S. application Ser. No. 13/353,898, filed Jan. 19, 2012, which claims benefit of priority from the prior Japanese Application No. 2011-014787, filed Jan. 27, 2011; the entire contents of all of which are incorporated herein by reference.

BACKGROUND OF THE INVENTION

The present invention relates to a semiconductor device, and more particularly to an arrangement of a plurality of pads formed on a semiconductor chip included in a semiconductor device.

A semiconductor chip included in a semiconductor device has a plurality of pads, which are connected to external terminals. During a manufacturing process of the semiconductor chip, a probe needle of a test device for an electric test (pellet-on-wafer (P/W) test) is pressed against some of those pads.

A related semiconductor device is disclosed in JP-A 11-87441 (Patent Literature 1). When a probe needle is pressed against a pad for probing, a surface of the pad is scarred by the needle, making it difficult or uncertain to connect a bonding wire to that pad (bonding). In order to avoid such a situation, the related semiconductor device is configured such that a pad used for an electric test, which is hereinafter referred to as a dual-function pad, has a probe needle area against which a probe needle is pressed and a bonding wire area to which a bonding wire is connected. In other words, the dual-function pad is formed so as to have a larger area (larger pad area) as compared to a pad that is used for bonding but is not used for an electric test, which is hereinafter referred to as a dedicated pad.

SUMMARY

The shape and size of each pad and arrangement of pads greatly affect the size of a chip in a semiconductor device. Particularly, in a case of a semiconductor device having many pads relatively to a circuit scale, such as a semiconductor memory device having a small capacity and a large number of input/output data bits, the arrangement of pads is a primary factor to determine the size of a semiconductor device.

In the semiconductor device disclosed in Patent Literature 1, each of dedicated pads is roughly in the form of a square. Each of dual-function pads is in the form of a rectangle equivalent to two dedicated pads. The dual-function pads are placed so that their longer sides extend along a direction in which the pads are arranged. The dual-function pads and the dedicated pads are mixed in a row. With this arrangement, even though the dual-function pads have a pad area larger than the dedicated pads, it is not necessary to increase the size of the chip along a direction perpendicular to the direction in which the pads are arranged. Furthermore, all of the pads have the same size with respect to the direction perpendicular to the direction in which the pads are arranged. Therefore, a wiring layout pattern can be simplified around the pads. However, this arrangement suffers from a problem that the length of the row of the pads increases relatively to the number of the pads being arranged. In other words, the size of the chip increases along the direction in which the pads are arranged.

Meanwhile, if the dual-function pads are placed so that their longer sides extend along a direction perpendicular to the direction in which the pads are arranged, then the length of the row of the pads can be reduced. In this case, however, the dual-function pads and the dedicated pads have different lengths in the direction perpendicular to the direction in which the pads are arranged. Therefore, the size of the semiconductor chip needs to be increased in the direction perpendicular to the direction in which the pads are arranged. In order to prevent such an increase of the chip size, useless spaces should be eliminated by, for example, forming wiring layers in conformity to the irregularity in size of the pads. Specifically, if the dual-function pads are placed so that their longer sides extend along the direction perpendicular to the direction in which the pads are arranged, then a wiring layout pattern around the pads becomes complicated.

The present invention seeks to solve one or more of the above problems, or to improve upon those problems at least in part.

In one embodiment, there is provided a device that includes a semiconductor chip including an edge elongated in a first direction; a plurality of first pads formed on the semiconductor chip, the first pads being substantially equal in length in the first direction to each other; and a second pad formed on the semiconductor chip, the second pad being greater in length in the first direction than the first pads. The first pads and the second pad are arranged in a line elongated in the second direction, that is substantially perpendicular to the first direction, without an intervention of any one of the first pads between the second pad and the edge.

In another embodiment, there is a provided a device that includes a semiconductor chip; a plurality of first pads formed on the semiconductor chip, the first pads being substantially equal in size to each other; two second pads formed on the semiconductor chip, the two second pads being substantially equal in size to each other and being greater in length in a first direction than the first pads; and a third pad formed on the semiconductor chip, the third pad being substantially equal in length in the first direction to the first pads and being greater in length in the second direction, that is perpendicular to the first direction, than the first pads. The first pads, the two second pads and the third pad are arranged in a line elongated in the second direction. The one of the two second pads is disposed at one end of the line. The other one of the two second pads is disposed at the other end of the line. The first pads and the third pad are sandwiched between the two second pads in the line.

In a still another embodiment, there is a provided a device that includes a semiconductor chip including an edge elongated in a first direction; a plurality of first pads formed on the semiconductor chip, each of the first pads being configured to be in contact with a corresponding one of a plurality of first bonding wires, the each of the first pads being free from being in contact with any probes when the device is under a test; and a second pad formed on the semiconductor chip, the second pad being configured to be in contact with a second bonding wire at a first area thereof and be in contact with a first probe at a second area thereof when the device is under the test, the first and the second areas of the second pad being arranged in the first direction. The first pads and the second pad are arranged in a line elongated in a second direction, that is substantially perpendicular to the first direction, without an intervention of any one of the first pads between the second pad and the edge.

BRIEF DESCRIPTION OF THE DRAWINGS

The above features and advantages of the present invention will be more apparent from the following description of certain preferred embodiments taken in conjunction with the accompanying drawings, in which:

FIG. 6 is a table explanatory of functions of the pads shown in FIG. 5;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described in detail with reference to FIGS. 1 to 9.

Figure 1:
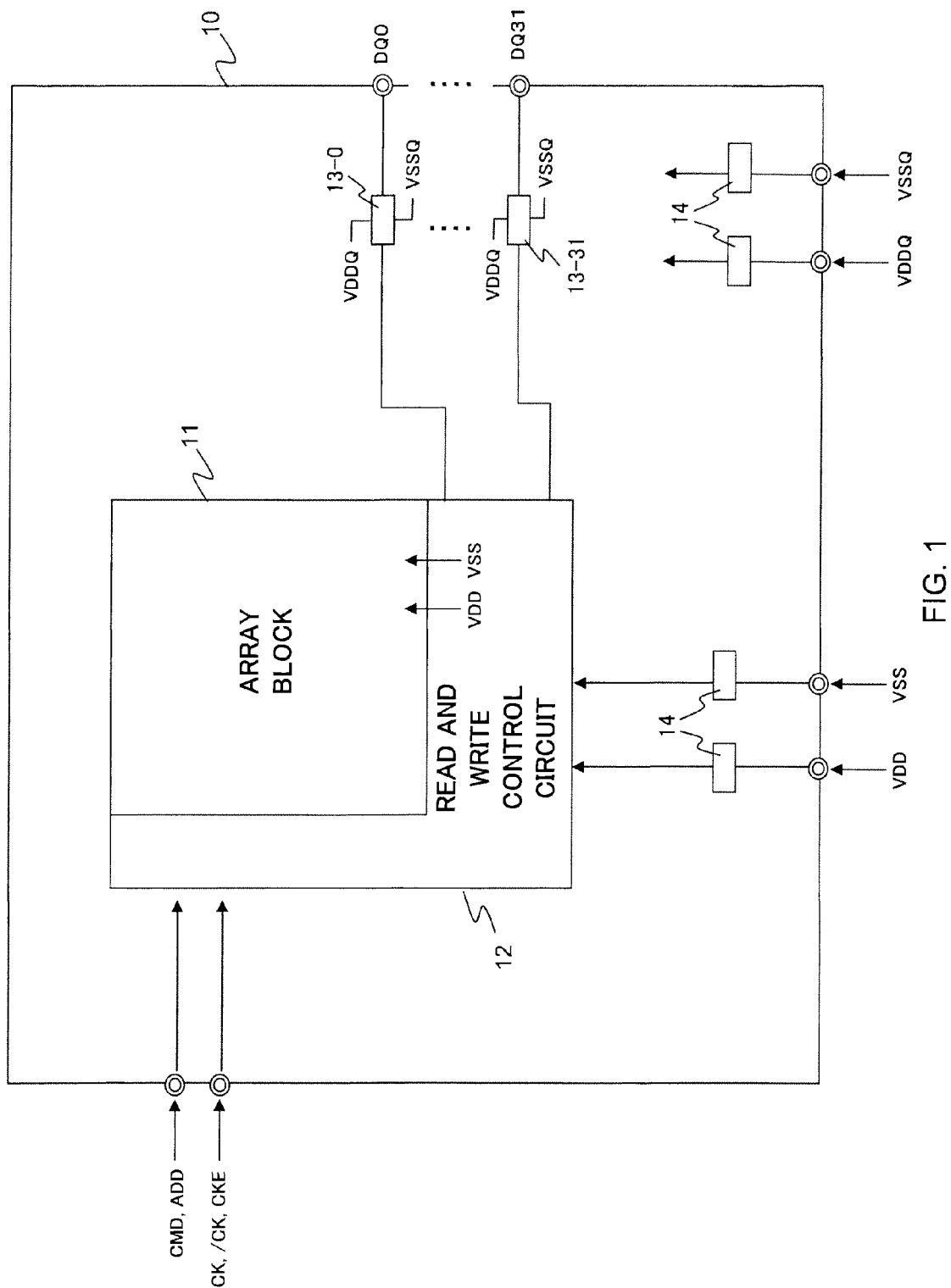
FIG. 1 is a schematic diagram showing a configuration of a semiconductor device according to a first embodiment of the present invention.

FIG. 1 is a schematic diagram showing a configuration of a semiconductor device according to a first embodiment of the present invention. FIG. 1 illustrates a dynamic random access memory (DRAM) as an example of the semiconductor device.

The semiconductor device of FIG. 1 includes a semiconductor chip 10 and input/output terminals (not shown) connected to the semiconductor chip 10. The input/output terminals include data terminals DQ0-DQ31, command terminals CMD, address terminals ADD, clock terminals CK, /CK, and CKE, power source terminals VDD, VSS, VDDQ, and VSSQ, and the like. FIG. 1 does not accurately illustrate the number of those input/output terminals.

The semiconductor chip 10 has an internal circuit and a plurality of pads. Each of the pads is connected to the internal circuit via a wiring layer and is also connected to one of the input/output terminals.

More specifically, the semiconductor chip 10 includes, as an internal circuit, an array block 11 having a large number of arrayed memory cells, a read/write control circuit 12 operable to perform a reading operation or a writing operation to the array block 11, a plurality of dual-function circuits 13 for electrostatic discharge (ESD) protection and output (13-0 to 13-31), and a plurality of ESD protection circuits 14.

Data are written into the array block 11 by control of the read/write control circuit 12. The array block 11 holds the written data therein.

The read/write control circuit 12 controls a reading operation and a writing operation to the array block 11 depending upon a command signal and an address signal supplied from the command terminals CMD and the address terminals ADD.

The dual-function circuits for ESD protection and output 13-0 to 13-31 are provided so as to correspond to the data terminals DQ0-DQ31. Data are read from the array block 11. The read data are supplied to the dual-function circuits 13-0 to 13-31 via the read/write control circuit 12. The dual-function circuits 13-0 to 13-31 supply the data to the corresponding data terminals DQ0-DQ31.

The ESD protection circuits 14 are provided so as to correspond to the power source terminals VDD, VSS, VDDQ, and VSSQ. The ESD protection circuits 14 corresponding to the power source terminals VDD and VSS supply power source potentials provided from the power source terminals VDD and VSS to the read/write control circuit 12, the array block 11, and the like. The ESD protection circuits 14 corresponding to the power source terminals VDDQ and VSSQ supply power source potentials provided from the power source terminals VDDQ and VSSQ to the dual function circuits 13-0 to 13-31.

The internal circuit of the semiconductor chip 10 does not directly relate to the present invention. Therefore, no further details of the internal circuit will be described.

Next, an arrangement of the pads in the semiconductor chip 10 will be described with reference to FIG. 2.

Figure 2:
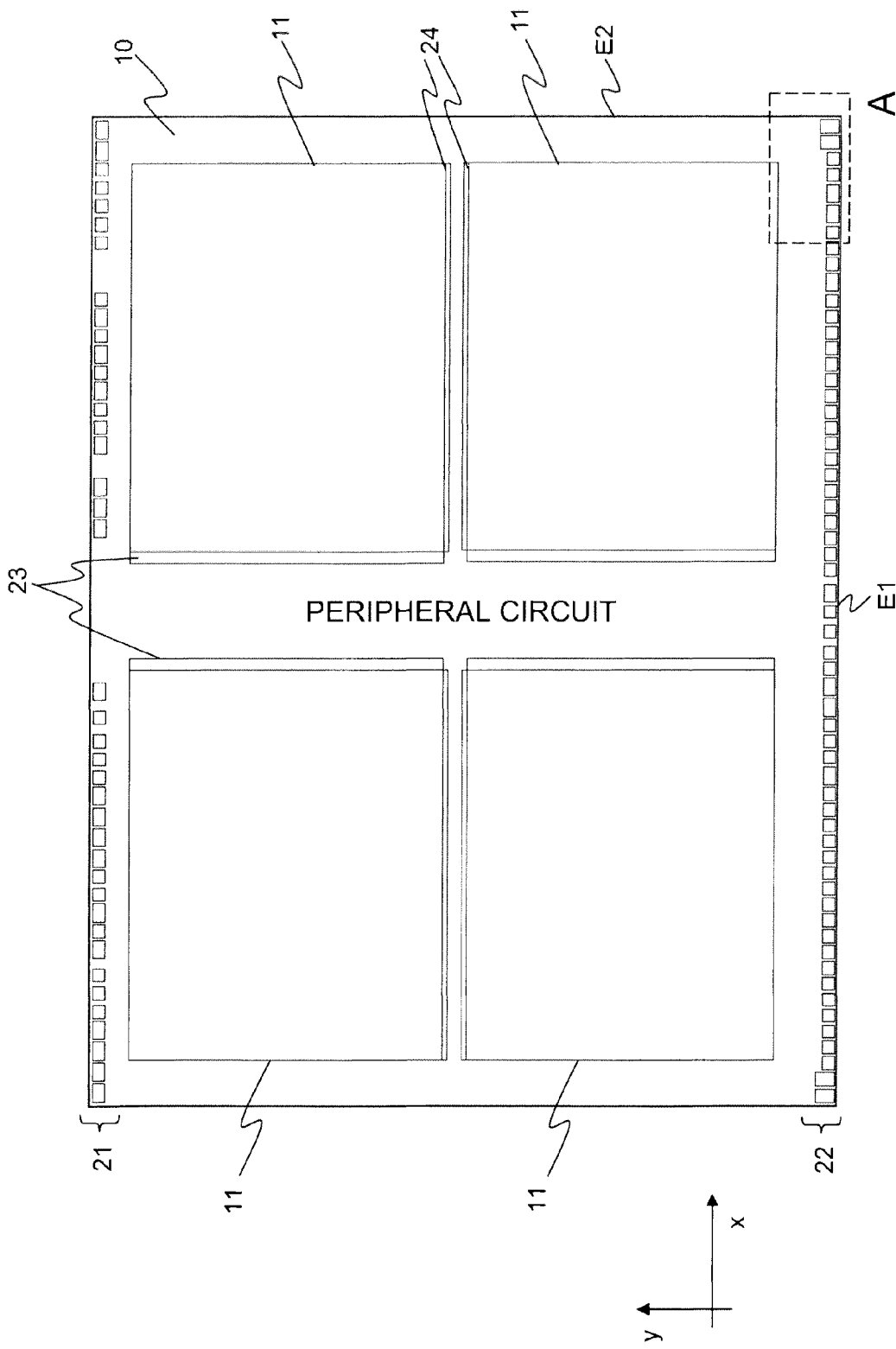
FIG. 2 is a diagram showing an arrangement of pads in a semiconductor chip of the semiconductor device illustrated in FIG. 1.

As shown in FIG. 2, the semiconductor chip 10 has a first edge E1 extending along a second direction (the lateral direction or the x-direction in FIG. 2), a first paired edge extending in parallel with the first edge E1, a second edge E2 extending along a first direction perpendicular to the second direction (the vertical direction or the y-direction in FIG. 2), and a second paired edge extending in parallel with the second edge E2.

Each of the pads is formed into a rectangular shape having two pairs of parallel sides. The pads are arranged in a line along the first edge E1 and the first paired edge. Those two rows of the pads are classified, for example, depending upon their functions. For example, the row of the pads located on an upper side of the semiconductor chip 10 in FIG. 2 may be defined as an address/command (AC) pad row 21, whereas the row of the pads located on a lower side of the semiconductor chip 10, i.e., near the first edge E1, may be defined as a data input/output (DQ) pad row 22.

Four array blocks 11 are arranged between those two pad rows 21 and 22. A row decoder 23 is formed along one side of each of the array blocks 11. A column decoder 24 is formed along the adjacent side of the array block 11. A read/write control circuit 12 is arranged in a peripheral circuit area between the array blocks 11.

The AC pad row 21 includes pads corresponding to the address terminals ADD, the command terminals CMD, the clock terminals CK, /CK, and CKE, and the power source terminals VDD and VSS. The DQ pad row 22 includes pads corresponding to the data terminals DQ, and the power source terminals VDD, VSS, VDDQ, and VSSQ.

Furthermore, each of the AC pad row 21 and the DQ pad row 22 includes a plurality of dual-function pads. A probe needle is brought into contact with the dual-function pads at the time of an electric test of the semiconductor chip (probing). The dual-function pads are also used for bonding at the time of packaging.

An example of the pad arrangement of the AC pad row 21 will be described in detail with reference to FIGS. 3 and 4.

Figures 3, 4:
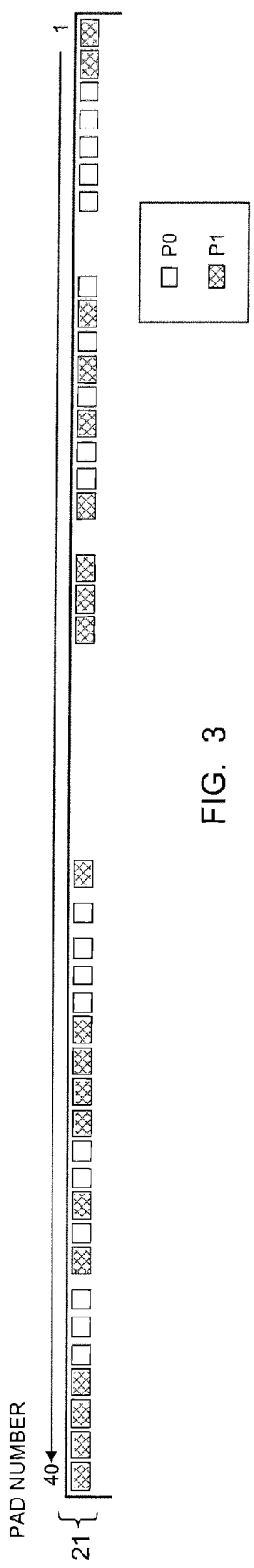
FIG. 3 is a diagram showing details of a pad arrangement of an address/command pad row illustrated in FIG. 2.
FIG. 4 is a table explanatory of functions of the pads shown in FIG. 3.

As shown in FIG. 3, the AC pad row 21 includes dedicated pads P0 and dual-function pads P1. The dedicated pads P0 are used for bonding but not for probing. The dual-function pads P1 are used for bonding and probing. The dedicated pads P0 and the dual-function pads P1 are formed so as to have the same length along the vertical direction (y-direction) in FIG. 3. Each of the dual-function pads P1 is formed so as to have a length greater than that of each of the dedicated pads P0 along the lateral direction (x-direction) in FIG. 3. In other words, the dual-function pads P1 are formed so that their longer sides extend in parallel with the first edge E1.

FIG. 4 shows the details of functions of the pads in the AC pad row 21. The pad numbers 1-40 are assigned to the pads in the order from the right side to the left side of FIG. 3.

As shown in FIG. 4, the pads Nos. 1, 2, 5-7, 18, 19, 34-36, 38, and 40 are power-source-related pads. The pads Nos. 9-16 and 27-33 are address-related pads. The pads Nos. 23-26 are command-related pads. The pads Nos. 17, 20, and 21 are clock-related pads. The remaining pads Nos. 8, 22, 37, and 39 are used for a test or change of settings.

Next, an example of the pad arrangement of the DQ pad row 22 will be described in detail with reference to FIGS. 5 and 6.

Figure 5:
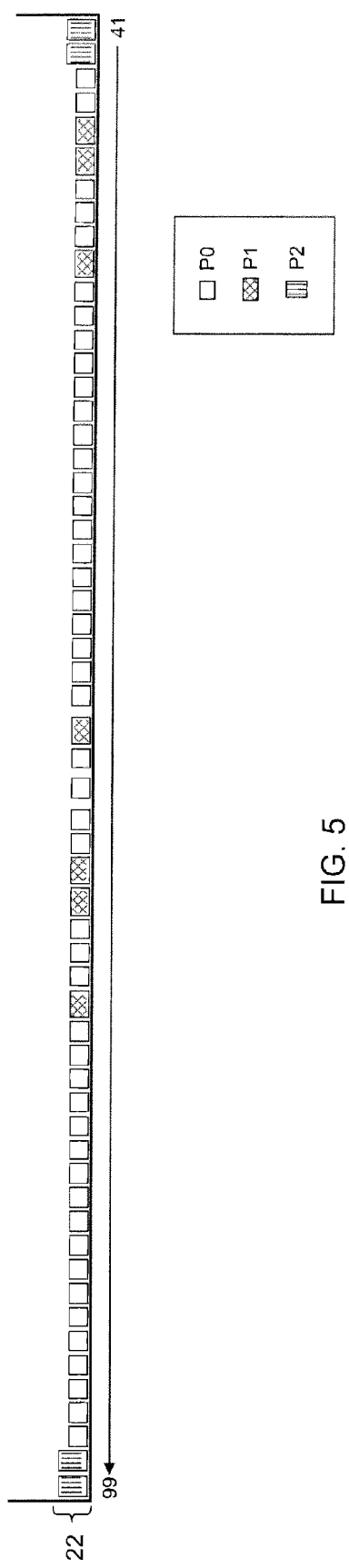
FIG. 5 is a diagram showing details of a pad arrangement of a DQ pad row illustrated in FIG. 2.

As shown in FIG. 5, the DQ pad row 22 includes dedicated pads P0 (first pads), first dual-function pads P1 (third pads), and second dual-function pads P2 (second pads). The dedicated pads P0 are used for bonding but not for probing. The first dual-function pads P1 and the second dual-function pads P2 are used for bonding and probing.

As in the case of the AC pad row 21, the dedicated pads P0 and the first dual-function pads P1 are formed so as to have the same length along the vertical direction (y-direction) in FIG. 5. Each of the first dual-function pads P1 is formed so as to have a length greater than that of each of the dedicated pads P0 along the lateral direction (x-direction) in FIG. 5.

Meanwhile, each of the second dual-function pads P2 is formed so as to have a length greater than the length of each of the dedicated pads P0 and the first dual-function pads P1 along the vertical direction (y-direction) in FIG. 5. The second dual-function pads P2 are formed so that their longer sides extend in parallel with the second edge E2.

FIG. 6 shows the details of functions of the pads in the DQ pad row 22. The pad numbers 41-99 are assigned to the pads in the order from the right side to the left side of FIG. 5.

As shown in FIG. 6, the pads Nos. 41, 42, 69, and 98-99 are power-source-related pads (VDD, VSS). The pads pad Nos. 45, 46, 55, 56, 65, 66, 74, 75, 84, 85, 94, and 95 are output-power-source-related pads (VDDQ, VDDS), which are a kind of power-source-related pads. The pads Nos. 43, 44, 47-52, 59-64, 67, 68, 72, 73, 76-81, 88-93, 96, and 97 are data-related pads. The pads Nos. 70 and 71 are clock-related pads. The remaining pads Nos. 53, 54, 57, 58, 82, 83, 86, and 87 are pads used for a data mask signal (DM) or a data strobe signal (DQS).

As is apparent from FIGS. 3 to 6, the number of pads in the DQ pad row 22 is greater than the number of pads in the AC pad row 21. Therefore, the length of the DQ pad row 22 determines the length of the first edge E1 of the semiconductor chip 10.

Figure 7:
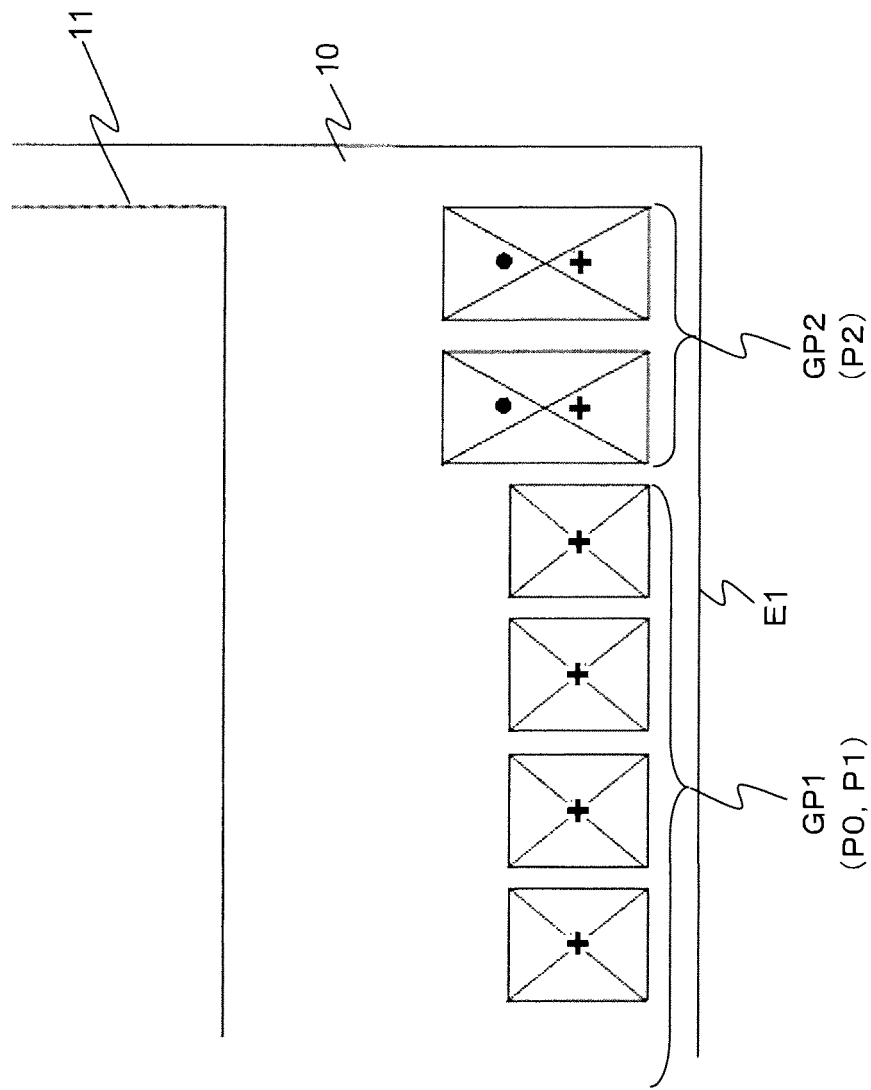
FIG. 7 is a diagram explanatory of an arrangement of pads.

In the present embodiment, as shown in FIG. 7, the pads of the DO pad row 22 are grouped into a first group located around the center of the DQ pad row 22 and a second group located on an outer side of the DQ pad row 22 (on one end or both ends of the DQ pad row 22) for minimizing the length of the DQ pad row 22. The first group is formed by first group pads GP1 (P0, P1). The first group pads GP1 have substantially the same length along the first direction. The second group is formed by second group pads GP2 (P2). The second group pads GP2 have a length greater than that of each of the first group pads GP1 along the first direction.

Thus, in the present embodiment, the first group pads GP1 of the first group, which is located around the center of the DQ pad row 22, is configured to have substantially the same length along the first direction. Accordingly, a wiring layout pattern is prevented from being complicated. Meanwhile, the second group pads GP2 of the second group are configured so that their longer sides extend substantially in parallel with the first direction. Thus, the entire length of the pad arrangement is reduced. No pads are interposed between the group pad GP2 located at the outermost position of the row and the edge E2 (or its paired edge) of the semiconductor chip 10 close to the outermost group pad GP2.

The first group may include only one type of the dedicated pads P0 and the first dual-function pads P1 or may include both types of the dedicated pads P0 and the first dual-function pads P1. In the example of FIG. 5, the first group includes both types of the dedicated pads P0 and the first dual-function pads P1.

The second group may be arranged on at least one side of the first group. The second group may include at least one second dual-function pad P2. In the example of FIG. 5, two second groups are arranged on both sides of the first group, and each of the second groups includes two second dual-function pads P2.

It is preferable for the second group pads (second dual-function pads P2) to be power-source-related pads (VDD, VSS) because the layout pattern of wiring layers connected to those pads can be simplified.

Figure 8:
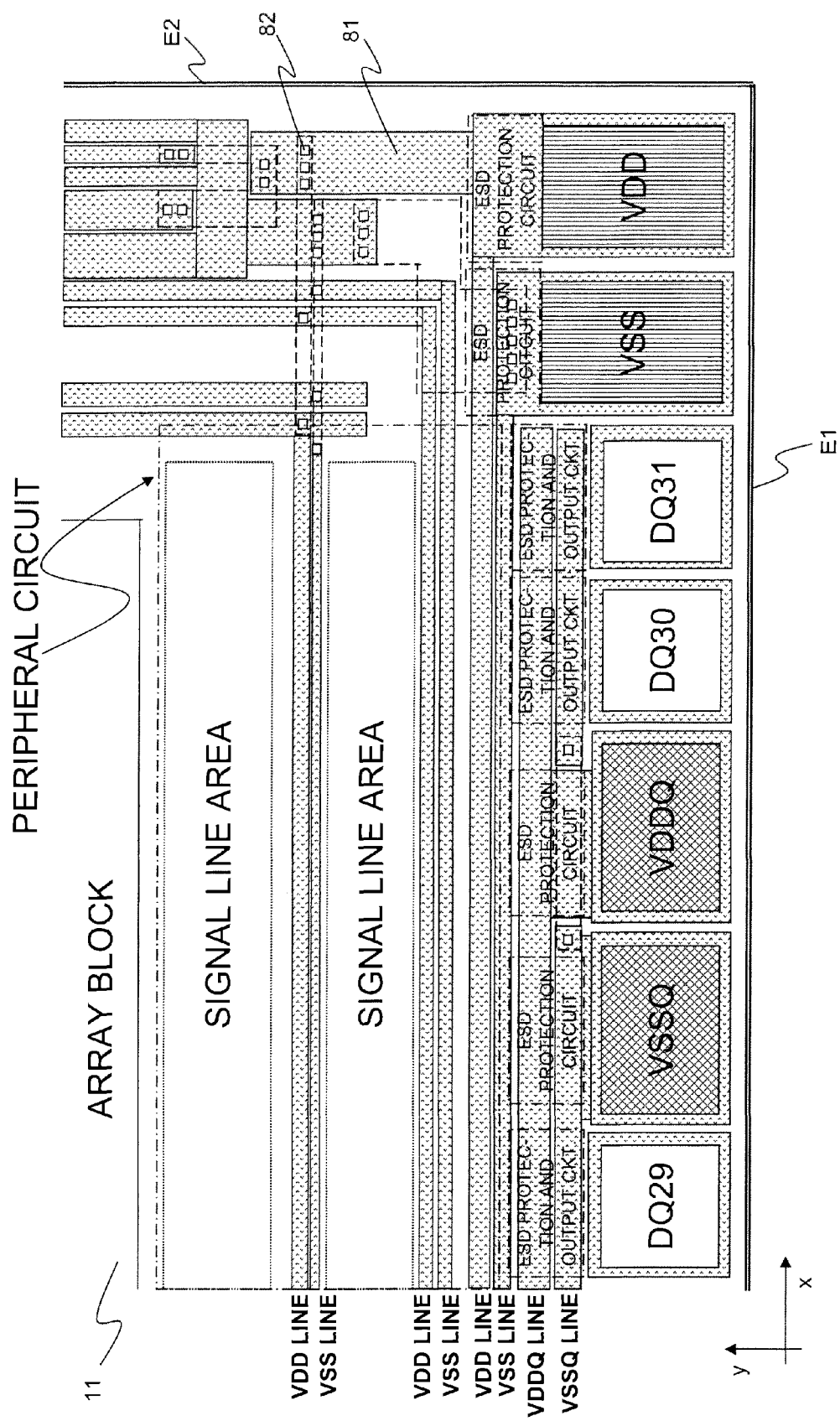
FIG. 8 is a diagram showing a detailed example of a portion surrounded by broken line A of FIG. 2.

FIG. 8 shows the details of the pad arrangement at a portion surrounded by broken line A of FIG. 2.

In FIG. 8, the uppermost aluminum wiring layers 81 are illustrated by hatching different from those of the first and second dual-function pads P1 and P2. The uppermost aluminum wiring layers 81 include VDD lines, VSS lines, a VDDQ line, and a VSSQ line.

The uppermost aluminum wiring layers 81 are covered with a polyimide film. Openings are formed in the polyimide film. Part of the uppermost aluminum wiring layers 81 exposed in the openings are used as the dedicated pads P0 (DQ29-DQ31), the first dual-function pads P1 (VDDQ, VSSQ), and the second dual-function pads P2 (VDD, VSS). Those pads are arranged in a line along the first edge E1 extending in the x-direction. The VDD lines, the VSS lines, the VDDQ line, and the VSSQ line of the aluminum wiring layers 81 are generally arranged linearly along the second direction or the first direction. Part of those lines is arranged near the first group pads along the first group pads. Not only the VDDQ line and the VSSQ line connected to the first dual-function pads P1 (VDDQ, VSSQ), but also the VDD lines and the VSS lines connected to the second dual-function pads P2 (VDD, VSS) may be arranged linearly along the first group pads. Thus, a simple wiring pattern can be used in the present embodiment.

The dual-function circuits 13 for ESD protection and output and the ESD protection circuits 14 are arranged adjacent to the corresponding pads. Those circuits are formed in a layer that is located lower than the uppermost aluminum wiring layers 81 (on a rear side of the paper of FIG. 8). The uppermost aluminum wiring layers 81 are also connected to lower layers of wiring layers or the like via through holes 82, which are illustrated by white small squares in FIG. 8.

Figure 9:
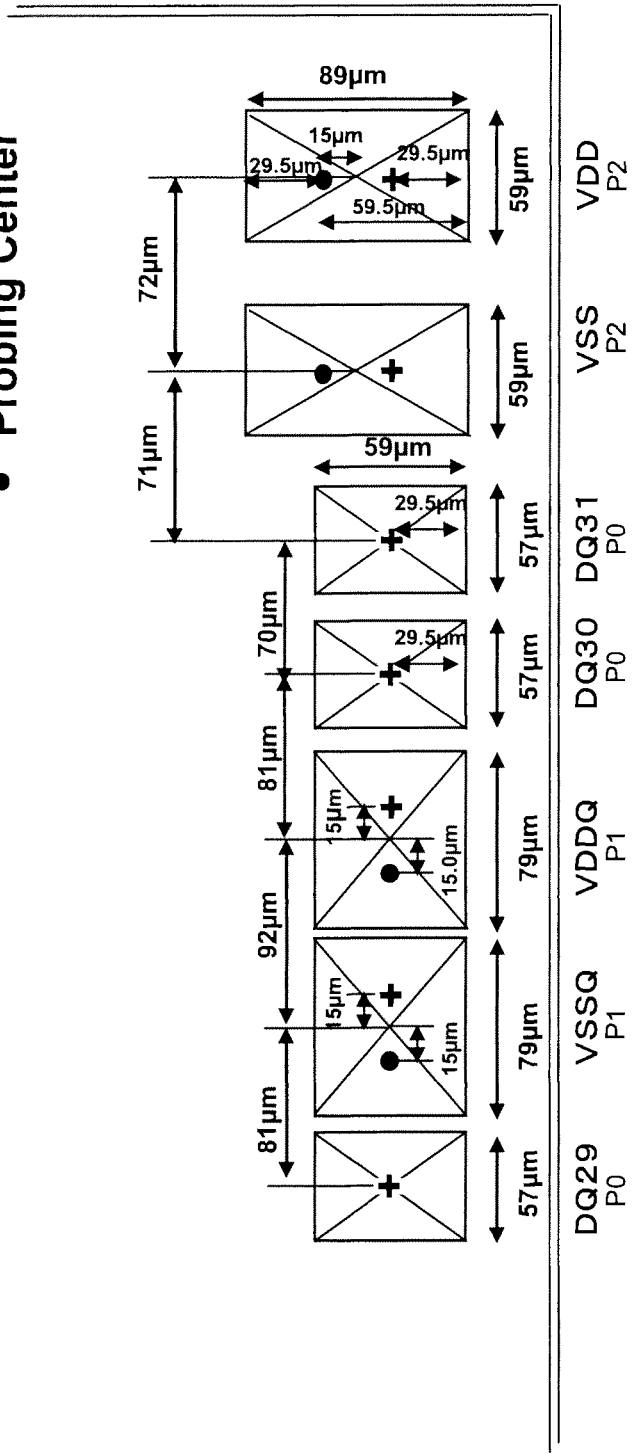
FIG. 9 is a diagram showing an example of actual dimension of pads illustrated in FIG. 8.

FIG. 9 shows an example of the actual dimension of the seven pads illustrated in FIG. 8. In FIG. 9, each of crisscrosses (+) indicates a central position of a bonding area. Each of black circles (●) indicates a central position of a probing area. The present invention is not limited to the dimension illustrated in FIG. 9, and any dimension may be used in the present invention. For example, the length of the second dual-function pad P2 along the x-direction may be made equal to the length of the dedicated pad P0 along the x-direction. Furthermore, the bonding area and the probing area may partially overlap each other.

As described above, a semiconductor device according to the present embodiment can prevent the size of a semiconductor chip from increasing and can also prevent a wiring layout pattern from being complicated even if an area of a dual-function pad used for bonding and probing is made greater than an area of a dedicated pad used for bonding but not for probing.

Specifically, according to the present embodiment, first group pads GP1 and second group pads GP2 are arranged on a semiconductor chip 10 having a first edge E1 extending along a second direction (x-direction) and a second edge E2 extending along a first direction (y-direction) perpendicular to the second direction. The first group pads GP1 and the second group pads GP2 are arranged in a line along the second direction in a state in which no first group pads GP1 are located between the second group pads GP2 and the second edge E2. The first group pads GP1 have substantially the same length along the first direction. The length of the second group pads along the first direction is greater than that of each of the first group pads GP1. Since the dual-function pads used for probing and bonding are arranged as the second group pads, the entire area of the semiconductor chip 10 is prevented from increasing.

Although the present invention has been described along with some embodiments, the present invention is not limited to the above embodiments. It should be understood that various changes and modifications may be made therein without departing from the scope of the present invention. For example, the above embodiments have been described using an example of a semiconductor device represented by a DRAM. Nevertheless, the present invention is applicable to any other semiconductor devices. The number and size of pads arranged are not limited to the illustrated examples and may be set in any desired manner.

What is claimed is:

1. A method for manufacturing a semiconductor device comprising the steps of:
    probing a first plurality of pads elongated in a first direction at a probing position on each of the first plurality of pads;
    probing a second pad elongated in a second direction substantially perpendicular to the first direction at a probing position on the second pad;
    bonding the first plurality of pads at a bonding position on each of the first plurality of pads offset from the probing position on each of the first plurality of pads in the first direction;
    bonding the second pad at a bonding position on the second pad offset from the probing position on the second pad in the second direction; and
    bonding a third plurality of pads at a bonding position on each of the third plurality of pads;
    wherein the first plurality of pads and the third plurality of pads are arranged in a line in the first direction, and the second pad is located at a first end of the line.

2. The method as claimed in claim 1, wherein the bonding position on each of the third plurality of pads is set to be substantially in the center of each of the third plurality of pads.

3. The method as claimed in claim 1, wherein each of the third plurality of pads is substantially square.

4. The method as claimed in claim 1 wherein each of the first plurality of pads is substantially rectangular.

5. The method as claimed in claim 1, wherein the second pad is substantially rectangular.

6. The method as claimed in claim 1, further comprising the steps of:
    probing a fourth pad elongated in the second direction at a probing position on the fourth pad; and
    bonding the fourth pad at a bonding position on the fourth pad offset from the probing position on the fourth pad in the second direction;
    wherein the fourth pad is located at either end of the line.

7. The method as claimed in claim 6, wherein the fourth pad is located adjacent the second pad.

8. The method as claimed in claim 7, wherein a spacing between the bonding position of the second pad and the bonding position of the fourth pad is larger than a spacing between bonding positions of two adjacent pads of the third plurality of pads.

9. The method as claimed in claim 6, wherein the fourth pad is located at a second end of the line opposite the first end of the line.

10. The method as claimed in claim 1, wherein the second pad is a power pad.

11. The method as claimed in claim 1, wherein the third plurality of pads are not probed.

12. The method as claimed in claim 1, wherein the first plurality of pads and the third plurality of pads are substantially equal in length in the second direction.

13. A method for manufacturing a semiconductor device comprising the steps of:
    probing a first plurality of pads elongated in a first direction at a probing position on each of the first plurality of pads;
    probing a second pad elongated in a second direction substantially perpendicular to the first direction at a probing position on the second pad;
    probing a third pad elongated in the second direction at a probing position on the third pad;
    bonding the first plurality of pads at a bonding position on each of the first plurality of pads offset from the probing position on each of the first plurality of pads in the first direction;
    bonding the second pad at a bonding position on the second pad offset from the probing position on the second pad in the second direction; and
    bonding the third pad at a bonding position on the third pad offset from the probing position on the third pad in the second direction;
    wherein the second pad is located at a first end of a line extending in the first direction and the third pad is located at either end of the line.

14. The method as claimed in claim 13, wherein the third pad is located adjacent the second pad.

15. The method as claimed in claim 13, wherein the third pad is located at a second end of the line opposite the first end of the line.

16. A method for manufacturing a semiconductor device comprising the steps of:
    probing two adjacent first pads each elongated in a first direction;
    bonding a second plurality of pads at a bonding position on each of the second plurality of pads, the second plurality of pads being arranged in a line extending in a second direction substantially perpendicular to the first direction and the two adjacent first pads being located at one end of the line; and
    bonding the two adjacent first pads at a bonding position on each of the two adjacent first pads;
    wherein a spacing between bonding positions of the two adjacent first pads is larger than a spacing between bonding positions of two adjacent pads of the second plurality of pads.

17. The method as claimed in claim 16, wherein at least one of the two adjacent first pads is a power pad.

18. The method as claimed in claim 16, wherein the second plurality of pads are not probed.

* * * * *